US011990459B2

(12) United States Patent
Ishizaki et al.

(10) Patent No.: US 11,990,459 B2
(45) Date of Patent: May 21, 2024

(54) METHOD FOR PRODUCING ELECTRONIC DEVICE COMPRISING SOLAR CELL STRUCTURE ALONG WITH DRIVE CIRCUIT

(71) Applicant: SHIN-ETSU HANDOTAI CO., LTD., Tokyo (JP)

(72) Inventors: Junya Ishizaki, Takasaki (JP); Shogo Furuya, Takasaki (JP); Tomohiro Akiyama, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 314 days.

(21) Appl. No.: 17/600,873

(22) PCT Filed: Mar. 16, 2020

(86) PCT No.: PCT/JP2020/011380
§ 371 (c)(1),
(2) Date: Oct. 1, 2021

(87) PCT Pub. No.: WO2020/209010
PCT Pub. Date: Oct. 15, 2020

(65) Prior Publication Data
US 2022/0173089 A1    Jun. 2, 2022

(30) Foreign Application Priority Data
Apr. 9, 2019 (JP) .................................. 2019-074375

(51) Int. Cl.
*H01L 31/02* (2006.01)
*H01L 23/00* (2006.01)
(Continued)

(52) U.S. Cl.
CPC ............ *H01L 25/167* (2013.01); *H01L 24/24* (2013.01); *H01L 24/29* (2013.01); *H01L 24/32* (2013.01);
(Continued)

(58) Field of Classification Search
CPC . H01L 25/167; H01L 24/94; H01L 31/02008; H01L 27/142; H01L 24/24;
(Continued)

(56) References Cited

U.S. PATENT DOCUMENTS 8,778,704 B1 * 7/2014 Lau .......................... H01L 24/97
257/434
9,837,453 B1 * 12/2017 Leobandung ..... H01L 21/02063
(Continued)

FOREIGN PATENT DOCUMENTS

CN    103985720 A    8/2014
JP    2007-36988 A   2/2007
(Continued)

OTHER PUBLICATIONS

Dec. 8, 2022 Extended Search Report in European Patent Application No. 20787736.6.
(Continued)

*Primary Examiner* — Didarul A Mazumder
(74) *Attorney, Agent, or Firm* — Oliff PLC

(57) ABSTRACT

The present invention is a method for producing an electronic device having a drive circuit including a solar cell structure, the method including the steps of: obtaining a bonded wafer by bonding a first wafer having a plurality of independent solar cell structures including a compound semiconductor, the solar cell structures being formed on a starting substrate by epitaxial growth, and a second wafer having a plurality of independent drive circuits formed, so that the plurality of solar cell structures and the plurality of
(Continued)

drive circuits are respectively superimposed; wiring the bonded wafer so that electric power can be supplied from the plurality of solar cell structures to the plurality of drive circuits respectively; and producing an electronic device having the drive circuit including the solar cell structure by dicing the bonded wafer. This provides a method for producing an electronic device including a drive circuit and a solar cell structure in one chip and having a suppressed production cost.

12 Claims, 6 Drawing Sheets

(51) Int. Cl.
*H01L 25/16* (2023.01)
*H01L 31/18* (2006.01)

(52) U.S. Cl.
CPC .............. *H01L 24/73* (2013.01); *H01L 24/83* (2013.01); *H01L 24/92* (2013.01); *H01L 24/94* (2013.01); *H01L 31/02008* (2013.01); *H01L 31/1876* (2013.01); *H01L 31/1892* (2013.01); H01L 24/82 (2013.01); H01L 31/1844 (2013.01); H01L 2224/24146 (2013.01); H01L 2224/245 (2013.01); H01L 2224/2919 (2013.01); H01L 2224/32145 (2013.01); H01L 2224/73217 (2013.01); H01L 2224/73267 (2013.01); H01L 2224/82106 (2013.01); H01L 2224/83203 (2013.01); H01L 2224/83862 (2013.01); H01L 2224/92144 (2013.01); H01L 2224/92244 (2013.01)

(58) Field of Classification Search
CPC ......... H01L 24/29; H01L 24/32; H01L 24/83; H01L 2224/73217; H01L 2224/73267; H01L 2224/92144; H01L 2224/92244; H01L 24/73; H01L 2224/83203; Y02E 10/544

USPC ......................................................... 438/59
See application file for complete search history.

(56) References Cited

U.S. PATENT DOCUMENTS

| | | | |
|---|---|---|---|
| 2010/0148293 A1* | 6/2010 | Jain ...................... | A61B 5/0017 257/E21.135 |
| 2012/0055532 A1 | 3/2012 | Wang et al. | |
| 2012/0235262 A1* | 9/2012 | Jones .................. | H01L 31/1832 257/431 |
| 2013/0320476 A1* | 12/2013 | Jain ...................... | A61B 5/0017 257/434 |
| 2014/0225211 A1* | 8/2014 | Lau ......................... | H01L 23/58 438/59 |
| 2014/0353791 A1* | 12/2014 | Jain ...................... | A61B 5/6846 257/434 |
| 2016/0111587 A1* | 4/2016 | Jones .................. | H01L 31/1032 438/67 |
| 2018/0033906 A1* | 2/2018 | Rodbell .............. | H01L 31/1892 |

FOREIGN PATENT DOCUMENTS

| | | |
|---|---|---|
| JP | 2008-210886 A | 9/2008 |
| JP | 2013-4632 A | 1/2013 |
| JP | 2014-154172 A | 8/2014 |
| JP | 2018-148074 A | 9/2018 |
| KR | 10-1011025 B1 | 1/2011 |
| WO | 2018194030 A1 | 10/2018 |

OTHER PUBLICATIONS

Jun. 9, 2020 International Search Report issued in International Patent Application No. PCT/JP2020/011380.
Sep. 28, 2021 International Preliminary Report on Patentability issued in International Patent Application No. PCT/JP2020/011380.
Oct. 1, 16, 2023 Office Action issued in Chinese Patent Application No. 202080026889.4.
Dec. 6, 2023 Office Action issued in Korean Application No. 2021-7031800.

* cited by examiner

[FIG. 1]
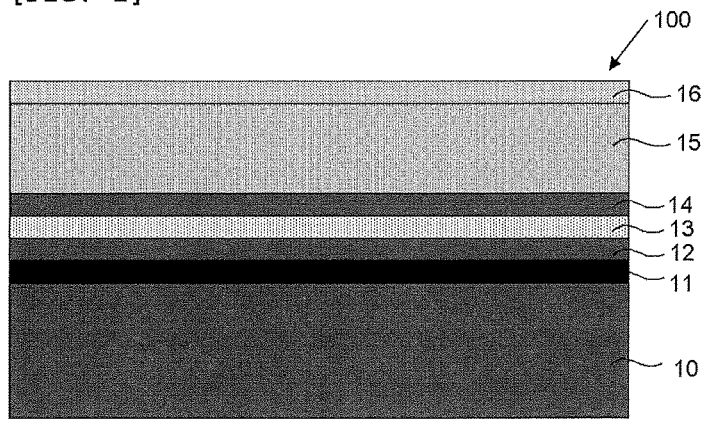
[FIG. 2]
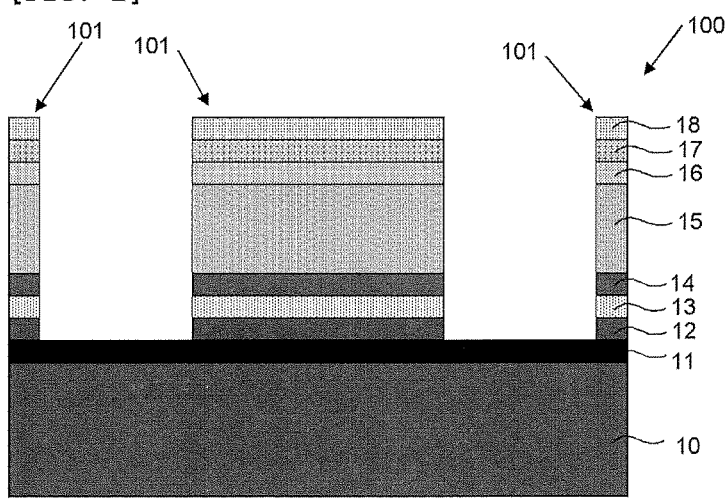
[FIG. 3]
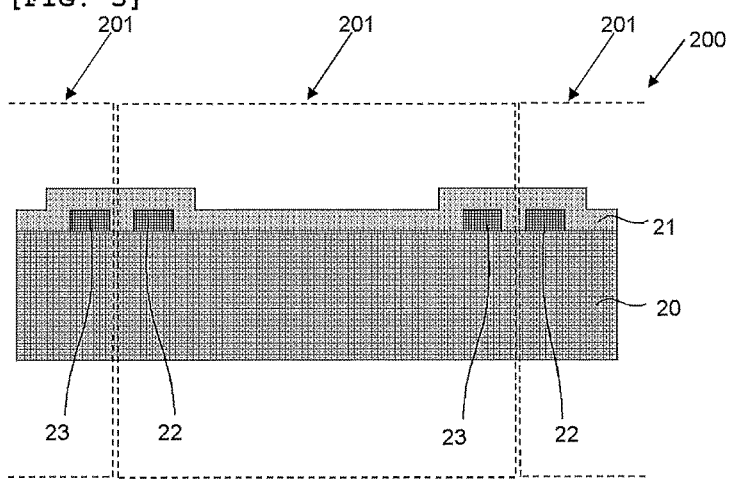

[FIG. 4]
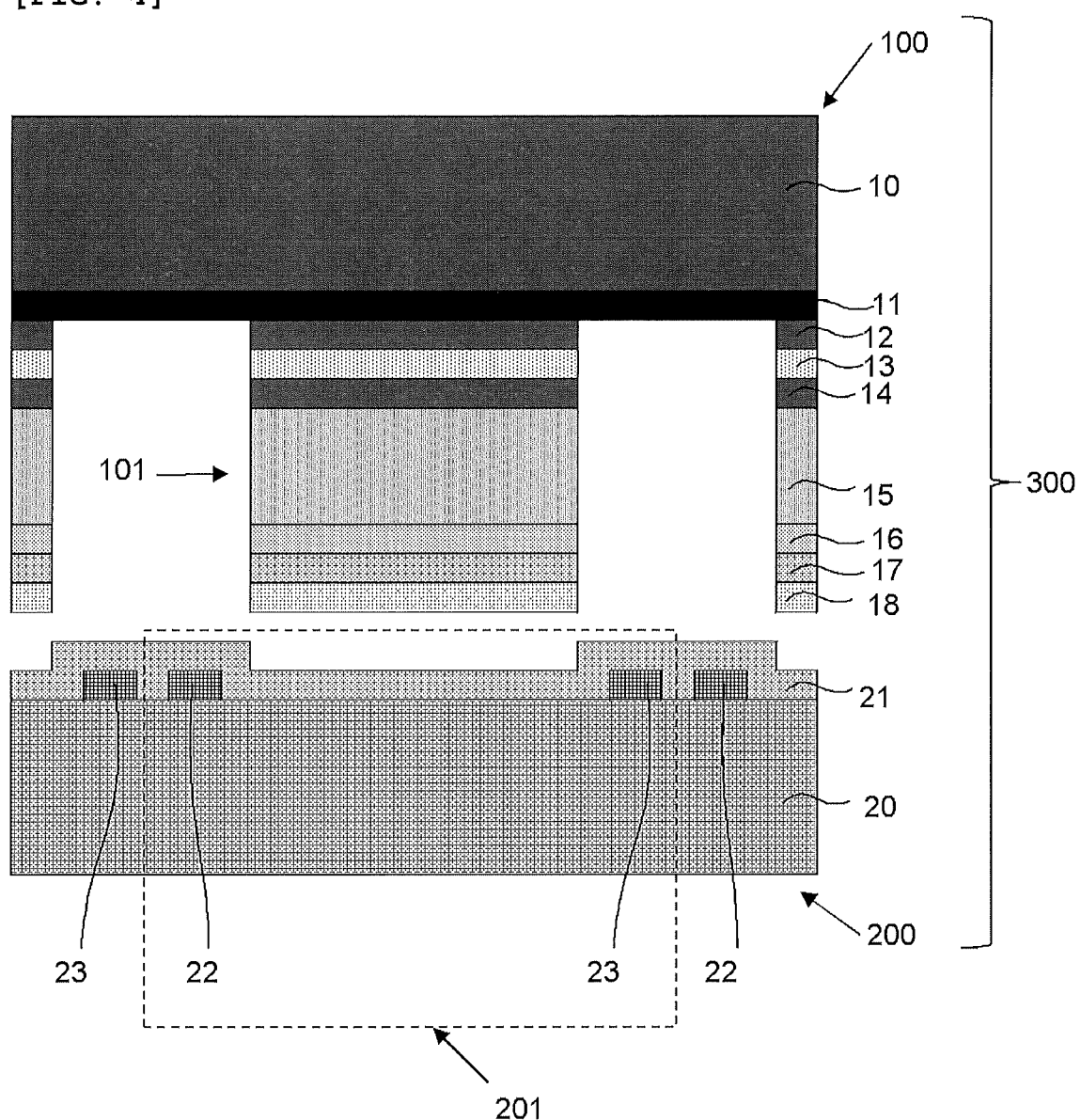

[FIG. 5]
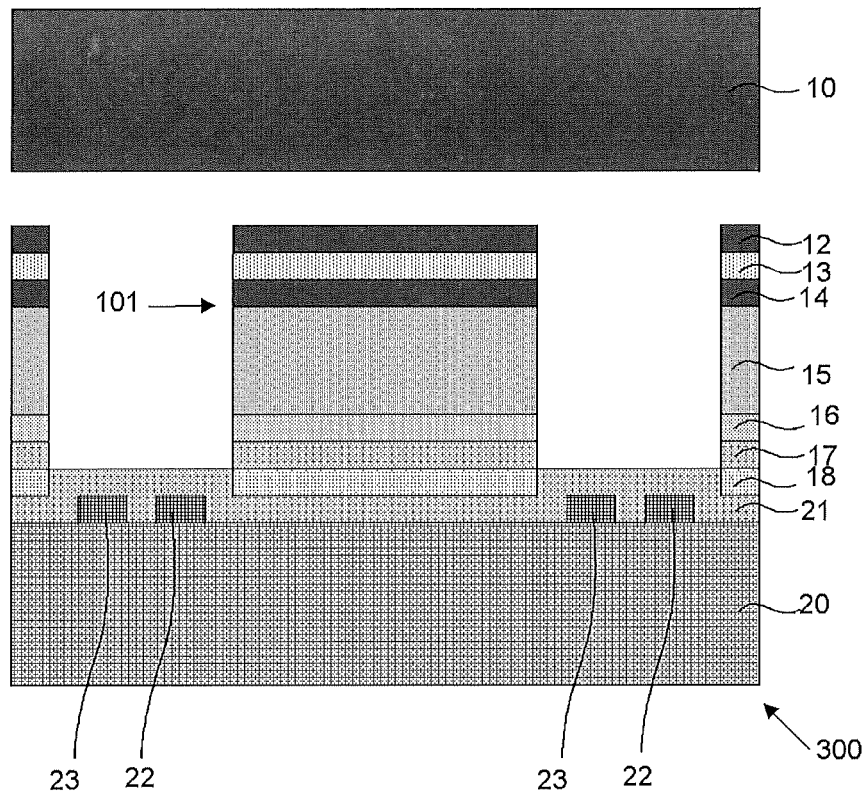
[FIG. 6]
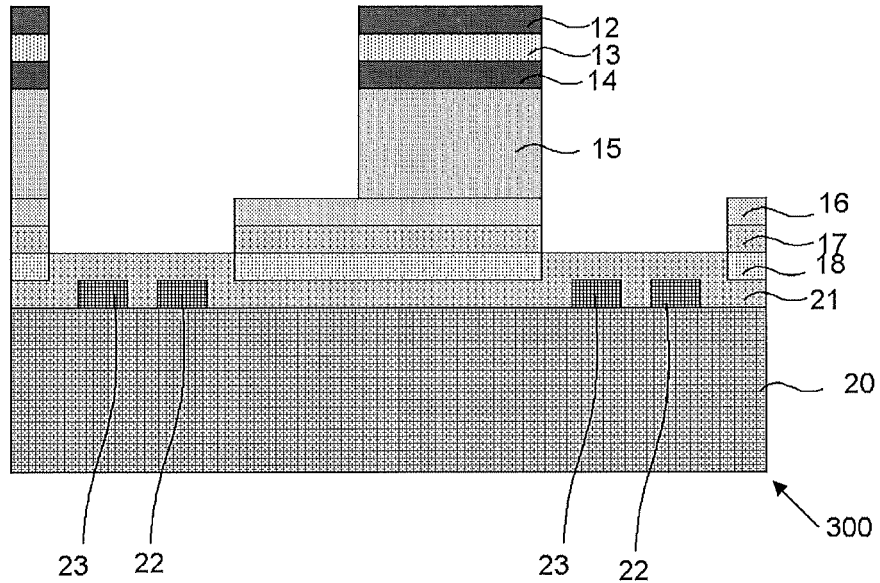

[FIG. 7]
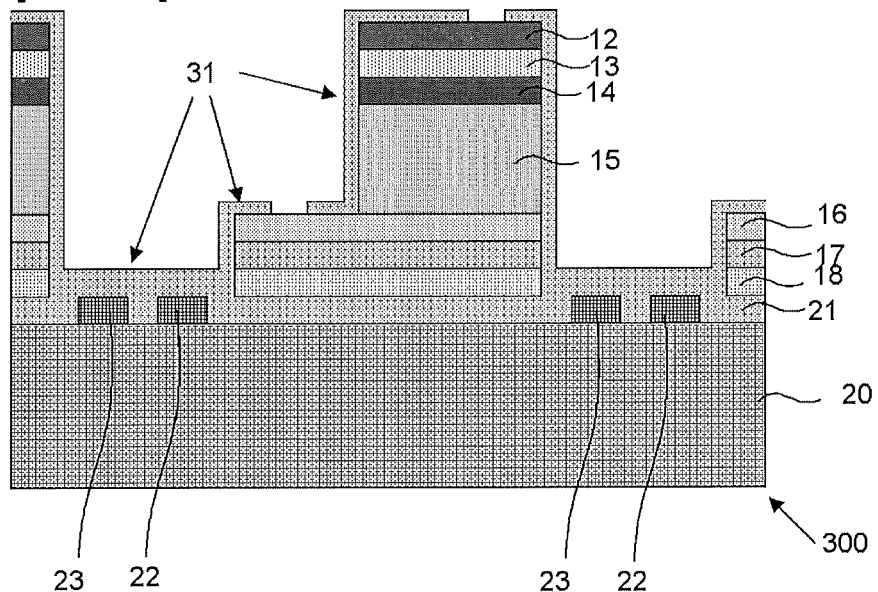
[FIG. 8]
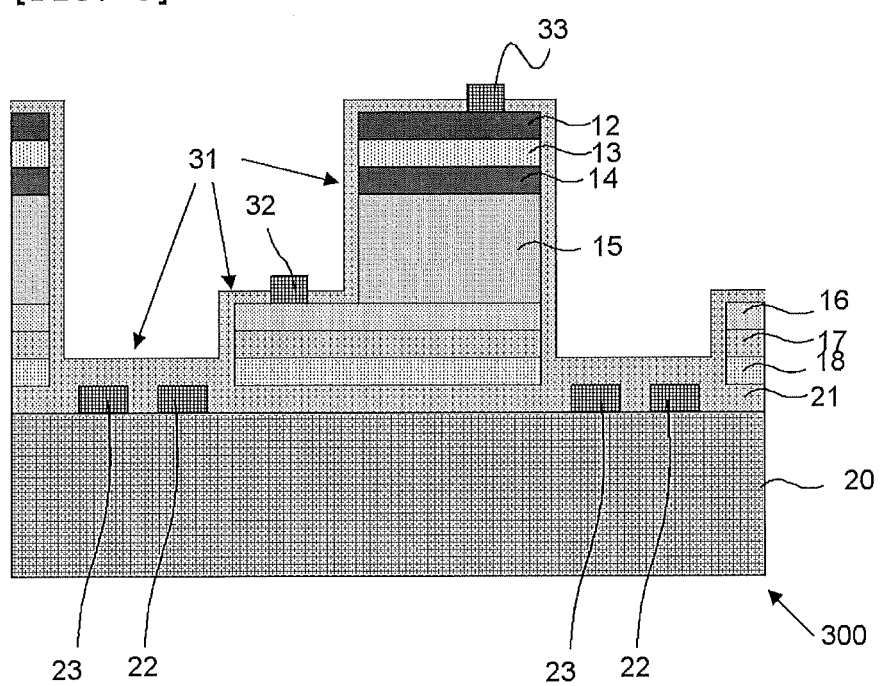

[FIG. 9]
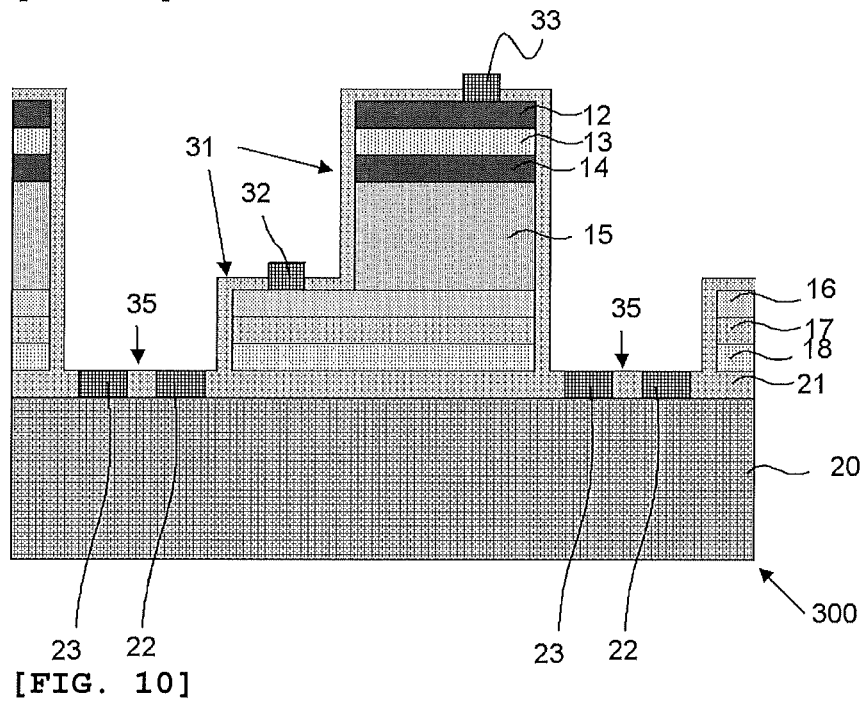
[FIG. 10]
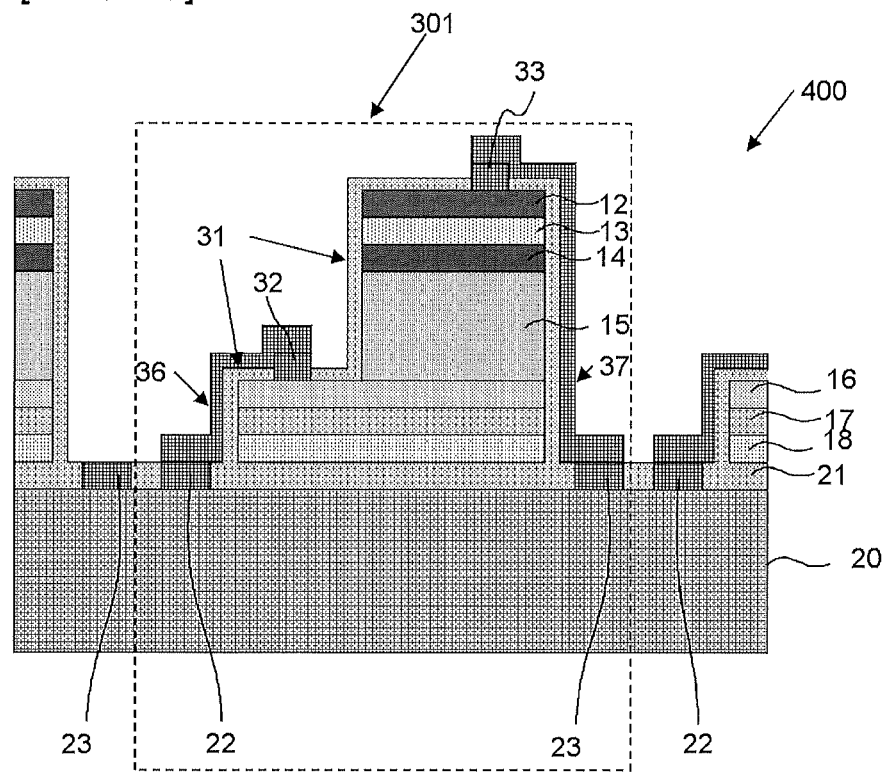

[FIG. 11]
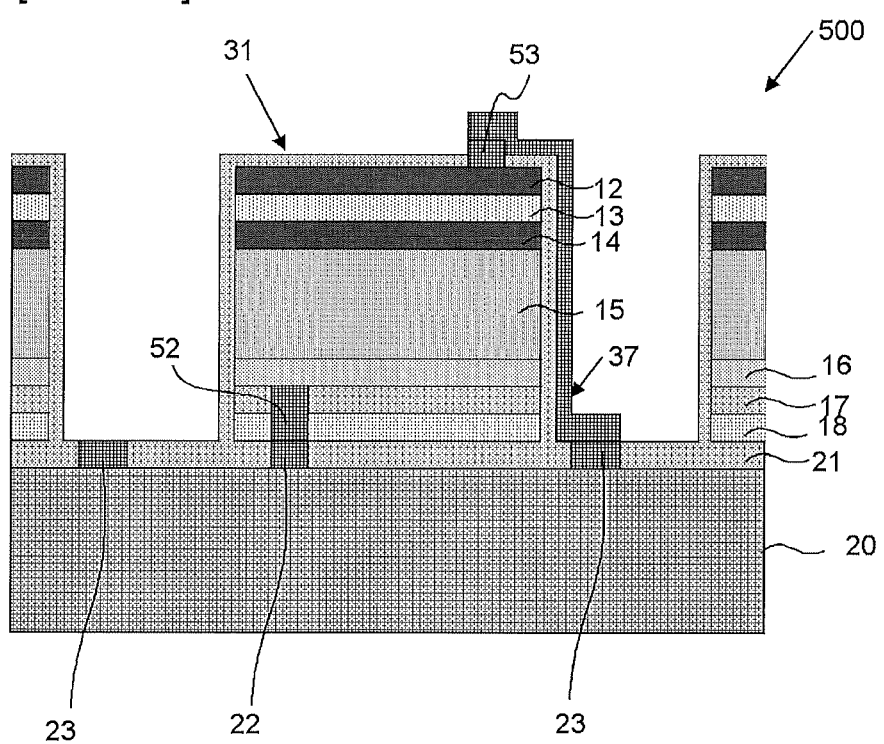

METHOD FOR PRODUCING ELECTRONIC DEVICE COMPRISING SOLAR CELL STRUCTURE ALONG WITH DRIVE CIRCUIT

TECHNICAL FIELD

The present invention relates to a method for producing an electronic device.

BACKGROUND ART

Electronic devices such as sensors for IoT (Internet of Things) require chips that are compact and that are driven with low power consumption, and are required to be inexpensive. For such electronic devices, it is ideal to provide a power source on the outside to drive various sensors by electric power supplied from outside to achieve stable operation. However, mounting cost required for wiring becomes massive, and inexpensive sensor-mounting becomes difficult. Accordingly, sensors for IoT require the realization of devices that do not need to be wired for a drive power source.

In addition, an electronic device needs to be compact in order to be inexpensive. In order to realize the above conditions, it is necessary to achieve a drive circuit and a drive-power-receiving device in one chip in an electronic device. As a system for obtaining a power supply wirelessly, it is possible to select either microwaves or light. However, microwaves have great output attenuation due to distance, and are not suitable as an electricity supply system for sensors for IoT having a dispersal arrangement.

Accordingly, an optical wireless power feeding system is suitable for use in IoT sensors.

A power receiving device for optical wireless power receiving is a solar cell, and it is difficult to provide a drive circuit and a power receiving device in one chip. It is possible to provide a drive circuit area first, and then form a solar cell device for receiving power (receiving light) in a region other than the drive circuit area.

However, the power receiving efficiency of a Si-based solar cell on which a drive circuit is mounted is not high, and a large area is required.

As a result, it is difficult to fabricate an inexpensive device. It is also possible to epitaxially grow a solar cell including a compound semiconductor in the solar cell portion in order to raise the efficiency of the power receiving device.

However, if epitaxial growth of a compound semiconductor solar cell on a Si substrate is attempted, lattice mismatch with the Si substrate becomes large. As a result, it is necessary to devise a buffer layer for epitaxial growth, and so forth in order to raise the quality of the crystal to form a high-efficiency power receiving solar cell, and this leads to a rise in epitaxial cost.

As a result, device production cost becomes high in any case.

CITATION LIST

Patent Literature

Patent Document 1: JP 2018-148074 A
Patent Document 2: JP 2013-4632 A
Patent Document 3: JP 2008-210886 A

SUMMARY OF INVENTION

Technical Problem

As a technique for mounting an additional device in an electronic device, there is a technique of bonding a functional layer and a substrate. Examples of techniques regarding the bonding of a functional layer and a substrate include Patent Documents 1 to 3. Patent Document 1 discloses a technique of bonding a functional layer and a substrate with BCB (benzocyclobutene). Patent Document 2 discloses a technique of etching a sacrificial layer. Patent Document 3 discloses a technique of flip-bonding a chip to a drive circuit substrate. However, Patent Documents 1 to 3 do not disclose techniques regarding methods for producing an electronic device provided with a drive circuit and a solar cell structure in one chip.

The present invention has been made in view of the above-described problems, and an object thereof is to provide a method for producing an electronic device including a drive circuit and a solar cell structure in one chip and having a suppressed production cost.

Solution to Problem

To achieve the object, the present invention provides a method for producing an electronic device having a drive circuit comprising a solar cell structure, the method comprising the steps of:
  obtaining a bonded wafer by bonding a first wafer having a plurality of independent solar cell structures comprising a compound semiconductor, the solar cell structures being formed on a starting substrate by epitaxial growth, and a second wafer having a plurality of independent drive circuits formed, so that the plurality of solar cell structures and the plurality of drive circuits are respectively superimposed;
  wiring the bonded wafer so that electric power can be supplied from the plurality of solar cell structures to the plurality of drive circuits respectively; and
  producing an electronic device having the drive circuit comprising the solar cell structure by dicing the bonded wafer.

The area of an electronic device can be made extremely small by bonding, in this manner, a first wafer having a plurality of independent solar cell structures and a second wafer having a plurality of independent drive circuits formed, so that the plurality of solar cell structures and the plurality of drive circuits are respectively superimposed. Thus, it is possible to suppress the production cost of an electronic device having a drive circuit including a solar cell structure.

Furthermore, the bonding is preferably carried out using a thermosetting adhesive.

By carrying out the bonding using a thermosetting adhesive as described, the bonding can be performed at a low temperature. Therefore, in addition, the physical properties of the solar cell structure and drive circuit portions do not change in the heat treatment required for bonding, so that the bonding step can be performed after forming the solar cell structure and the drive circuit.

In this event, the thermosetting adhesive can have a thickness of 2.0 μm or more.

Adhesive strength can be strengthened by providing the thermosetting adhesive at a thickness of 2.0 μm or more in this manner.

Furthermore, the starting substrate is preferably isolated from the bonded wafer after carrying out the bonding.

By isolating the starting substrate from the bonded wafer in this manner, the starting substrate can also be reused, and costs can be reduced.

Furthermore, in the inventive method for producing an electronic device, the wiring can be carried out by:
- providing a pad electrode in the second wafer before carrying out the bonding so that electric power can be supplied to the drive circuit;
- forming an electrode for a solar cell structure at least either one of before or after carrying out the bonding so that electric power can be extracted from the solar cell structure of the first wafer; and
- electrically connecting the pad electrode and the electrode for a solar cell structure.

In the inventive method for producing an electronic device, the wiring can be carried out in this manner, to be specific.

Advantageous Effects of Invention

According to the inventive method for producing an electronic device, it is possible to make the area of an electronic device having a drive circuit including a solar cell structure extremely small. Thus, the production cost of electronic devices can be suppressed.

BRIEF DESCRIPTION OF DRAWINGS

FIG. 1 is a schematic view showing an electronic device process of the present invention in progress, and is a schematic view showing a first wafer.

FIG. 2 is a schematic view showing an electronic device process of the present invention in progress, and is a schematic view showing the first wafer having an adhesive layer formed.

FIG. 3 is a schematic view showing an electronic device process of the present invention in progress, and is a schematic view showing a second wafer.

FIG. 4 is a schematic view showing an electronic device process of the present invention in progress, and is a schematic view showing the bonding of the first wafer and the second wafer.

FIG. 5 is a schematic view showing an electronic device process of the present invention in progress, and is a schematic view showing the isolation of a starting substrate from the bonded wafer.

FIG. 6 is a schematic view showing an electronic device process of the present invention in progress, and is a schematic view showing the partial processing of the bonded wafer.

FIG. 7 is a schematic view showing an electronic device process of the present invention in progress, and is a schematic view showing the $SiO_2$ coating of the bonded wafer.

FIG. 8 is a schematic view showing an electronic device process of the present invention in progress, and is a schematic view showing the formation of electrodes on the bonded wafer.

FIG. 9 is a schematic view showing an electronic device process of the present invention in progress, and is a schematic view showing the exposure of pad electrodes of the bonded wafer.

FIG. 10 is a schematic view showing an electronic device process of the present invention in progress, and is a schematic view showing the wiring of the bonded wafer.

FIG. 11 is a schematic view showing an electronic device process of the present invention in progress, and is a schematic view showing a bonded wafer according to the second embodiment.

DESCRIPTION OF EMBODIMENTS

As stated above, electronic devices such as sensors for IoT require chips that are compact and that are driven with low power consumption, and are required to be inexpensive. It is ideal to provide a power source on the outside to drive various sensors by electric power supplied from outside to achieve stable operation. However, mounting cost required for wiring becomes massive, and inexpensive sensor-mounting becomes difficult. Accordingly, sensors for IoT require the realization of devices that do not need to be wired for a drive power source. The present inventors have earnestly studied and found out the following. An electronic device having a drive circuit including a solar cell structure obtained by bonding a first wafer having a plurality of independent solar cell structures including a compound semiconductor, the solar cell structures being formed on a substrate by epitaxial growth, and a second wafer having a plurality of independent drive circuits formed, so that the plurality of solar cell structures and the plurality of drive circuits are respectively superimposed, providing an electrode and wiring so that electric power can be supplied from the plurality of solar cell structures to the plurality of drive circuits respectively, and then dicing makes it possible to make the area of the electronic device extremely small so that production cost can be suppressed. Thus, the present invention has been completed.

The present invention is a method for producing an electronic device having a drive circuit including a solar cell structure, and includes the following steps. That is, the steps of (a) obtaining a bonded wafer by bonding a first wafer having a plurality of independent solar cell structures including a compound semiconductor, the solar cell structures being formed on a starting substrate by epitaxial growth, and a second wafer having a plurality of independent drive circuits formed, so that the plurality of solar cell structures and the plurality of drive circuits are respectively superimposed, (b) wiring the bonded wafer so that electric power can be supplied from the plurality of solar cell structures to the plurality of drive circuits respectively, and (c) producing an electronic device having the drive circuit comprising the solar cell structure by dicing the bonded wafer.

Hereinafter, embodiments of the present invention will be described on the basis of the drawings.

First Embodiment

Firstly, a first wafer having a plurality of independent solar cell structures including a compound semiconductor, the solar cell structures being formed on a starting substrate by epitaxial growth is provided. FIG. 1 and FIG. 2 show schematic views of the first wafer 100. In the first wafer 100, a plurality of solar cell structures 101 are formed on a starting substrate 10 by epitaxial growth.

More specifically, the solar cell structures can be formed in the following manner, but the solar cell structures can adopt various structures including a compound semiconductor. Firstly, a p-GaAs buffer layer (not shown) with a thickness of 0.5 μm for example, a p-AlAs sacrificial layer 11 with a thickness of 0.3 μm for example, a p-GaAs contact layer 12 with a thickness of 0.3 μm for example, a p-$In_{0.5}Ga_{0.5}$P window layer 13 with a thickness of 0.2 μm for example, a p-GaAs emitter layer 14 with a thickness of 0.5 μm for example, an n-GaAs base layer 15 with a thickness of 3.5 μm for example, and a BSF (Back Surface Field) layer 16 with a thickness of 0.05 μm including n-In$_{0.5}$Ga$_{0.5}$P for example are formed on the starting substrate 10 including GaAs to prepare the first wafer 100 having the solar cell structures. At the stage of FIG. 1, device isolation has not been carried out, and the solar cell structures are not independent. The configuration, composition, thickness, etc. of each layer of the solar cell structures can be designed appropriately. For example, here, In$_{0.5}$Ga$_{0.5}$P can be laminated under conditions of pseudo-lattice matching, and is not limited to the exemplified composition as long as the film thickness is the critical film thickness or less.

Next, a SiO$_2$ film 17 is formed on the first wafer 100 by a P-CVD method (plasma-chemical vapor deposition method) by, for example, 0.1 μm. Then, a BCB (benzocyclobutene) film 18 is formed on the SiO$_2$ film 17 as a thermosetting adhesive by a spin-coating method by, for example, 0.2 μm. The BCB film (that is, the thermosetting adhesive) 18 preferably has a thickness of 0.05 μm or more, more preferably 0.1 μm or more. A BCB 18 film with such a thickness enables the realization of more favorable wafer bonding. The thickness of the BCB film 18 (the thickness of the thermosetting adhesive) can be 2.0 μm or less, and furthermore, can be 1.0 μm or less. Such a thickness of the BCB film 18 can suppress a rise in cost. In addition, with such a thickness, the amount of deformation due to bonding pressure can be made small and the amount adhered to a side of an isolated pattern is not increased, so that the subsequent steps of etching a sacrificial layer and forming a pattern can be performed easily.

In the present embodiment, a structure having a SiO$_2$ film 17 formed in the first wafer 100 is given as an example, and the SiO$_2$ film 17 is an adhesion reinforcement layer for the BCB film 18. Therefore, the SiO$_2$ film 17 does not necessarily need to be provided. As a thermosetting adhesive that can be used in the present invention, a BCB (benzocyclobutene) resin is preferably used, but the thermosetting adhesive is not limited thereto.

After applying the BCB film 18, it is preferable to eliminate a solvent by a heat treatment at around 100° C.

In addition, the thickness of the thermosetting adhesive such as the BCB film can also be 2.0 μm or more. Adhesive strength can be strengthened by providing the thermosetting adhesive at a thickness of 2.0 μm or more. In particular, when the etching of the sacrificial layer is performed to isolate the starting substrate and only the epitaxial layer remains, delamination of the epitaxial layer can be prevented more effectively. When the thermosetting adhesive is to be a thick film having a thickness of 3.0 μm or more, for example, a thick film can be formed by a method of once applying an adhesive, then carrying out a curing treatment under heating, and further applying and superimposing the adhesive.

Next, a resist pattern that is open in portions intended for device isolation (device-isolation intended portion) for making the solar cell structures independent is formed on the BCB film 18 by a photoresist process. The BCB film 18 and the SiO$_2$ film 17 are patterned by performing an ICP (inductively coupled plasma) treatment under a mixed plasma atmosphere of a fluorine-containing gas (NF$_3$, SF$_6$, or the like) and Ar gas.

As conditions for the ICP treatment, for example, the atmosphere pressure can be 1.0 Pa, and the total flow rate of the NF$_3$ and Ar gasses can be 50 sccm. However, the conditions are not limited thereto as long as patterning of the BCB/SiO$_2$ is possible under the conditions.

After opening patterning of the BCB film 18/SiO$_2$ film 17, the resist pattern is removed. For example, the resist removal can be performed by an aching treatment, but the removal is not limited thereto, and the resist may also be removed by organic cleaning and other degreasing treatments.

The opening in the BCB film 18/SiO$_2$ film 17 is etched with a mixed solution of tartaric acid and hydrogen peroxide regarding the GaAs layer and etched with a mixed liquid of hydrochloric acid and phosphoric acid regarding the InGaP to etch the device-isolation intended portion (see FIG. 2). Note that the mixed solution of tartaric acid and hydrogen peroxide has etching selectivity to InGaP and the mixed liquid of hydrochloric acid and phosphoric acid has etching selectivity to GaAs, and therefore, the solutions are appropriately switched for etching each layer. By the above process, a first wafer 100 having a plurality of independent solar cell structures 101 including a compound semiconductor can be prepared as shown in FIG. 2.

Independently of the first wafer 100, a second wafer having a plurality of independent drive circuits formed is prepared. The second wafer is preferably provided by forming a drive circuit on a silicon (Si) substrate. Specifically, a second wafer 200 having a drive circuit and power receiving pad portions (pad electrodes 22 and 23) for input on a Si substrate (drive circuit substrate 20) is prepared as shown in FIG. 3. The drive circuit is formed in accordance with the required performance, and is preferably configured to have a diode for rectification for preventing current reverse flow from the solar cell structure connected to the power receiving pads (pad electrodes 22 and 23). FIG. 3 shows an example where a plurality of independent drive circuits 201 (the parts surrounded by broken lines are individual drive circuits) are formed.

Next, a SiO$_2$ film 21 is preferably formed on the drive circuit substrate surface with a thickness of, for example, 0.1 μm (see FIG. 3).

In the present embodiment, a structure in which a SiO$_2$ film 21 is formed on the drive circuit substrate is given as an example. However, the SiO$_2$ film 21 is an adhesion reinforcement layer for the above-described BCB film, being a thermosetting adhesive, and therefore, the SiO$_2$ film 21 does not necessarily need to be provided.

Next, as shown in FIG. 4, a bonded wafer is obtained by bonding the first wafer 100 and the second wafer 200 so that the plurality of solar cell structures 101 and the plurality of drive circuits 201 are respectively superimposed. After bonding, the first wafer 100 and the second wafer 200 configure a bonded wafer 300 (FIG. 4 shows a state just before bonding). Here, more specifically, the first wafer 100 and the second wafer 200 are aligned so that the positions of the pads (pad electrodes 22 and 23) on the second wafer 200 side come to predetermined positions. The first wafer 100 and the second wafer 200 are superimposed to face each other, and are bonded while applying, for example, heat of 300° C. and pressure of about 250 N/cm$^2$ (see FIG. 4). The temperature of the bonding via the BCB film 18 is preferably 150° C. or higher, more preferably 210° C. or higher. The higher the temperature, the quicker the BCB curing time, but the temperature is preferably 400° C. or lower, more preferably 320° C. or lower from the viewpoint of suppressing change in the properties of the drive substrate as much as possible.

Furthermore, the bonding pressure is preferably 2 N/cm$^2$ or higher, more preferably 5 N/cm$^2$ or higher. A higher pressure is desirable since the higher the bonding pressure, the more easily bonding can be achieved. However, deformation amount due to bonding pressure becomes large so that the amount adhered to the side of the isolated pattern increases, making the subsequent steps of etching the sacrificial layer and pattern formation difficult. Therefore, the pressure is preferably 500 N/cm$^2$ or lower, more preferably 250 N/cm$^2$ or lower.

After the bonding, the sacrificial layer 11 is etched. In the case of a sacrificial layer including AlAs, the etching is performed with a fluorine-containing solution. Since the device-isolation intended portion is open, the fluorine-containing liquid reaches the AlAs sacrificial layer quickly and etches the sacrificial layer. Since the fluorine-containing liquid has etching selectivity to the layers other than the sacrificial layer, only the AlAs sacrificial layer is selectively removed. By the elimination of the sacrificial layer, the epitaxial layer to be a solar cell structure 101 remains on the second wafer 200, and the GaAs starting substrate 10 becomes isolated (see FIG. 5).

The isolated GaAs starting substrate 10 can be reused as a substrate for epitaxial growth. The starting substrate 10 can be repolished on the surface as necessary and then used.

Next, a partially open pattern is formed in the bonded wafer 300 by a photolithography method to form a pattern that exposes the BSF layer 16 portion. After forming the pattern that exposes the BSF layer 16 portion, the resist is removed (see FIG. 6). In order to expose the BSF layer 16, the above-described selective etching liquid may be used, or a dry process such as ICP may be applied.

After forming the exposed portion of the BSF layer 16, the entire wafer is coated with a SiO$_2$ film 31 having a thickness of 0.1 μm, for example. Next, a partially open pattern is formed by a photolithography method to form a pattern that is open in a part on the p-GaAs contact layer 12 and a part on the BSF layer 16, and a part of the SiO$_2$ film 31 is opened by etching with a fluorine-containing solution. After opening a part of the SiO$_2$ film 31, the resist is removed (see FIG. 7).

Next, electrodes 32 and 33 are formed in the SiO$_2$ openings. (FIG. 8).

The electrode 33, which is in contact with the p-GaAs contact layer 12 is formed with Au containing Be, and the electrode 32, which is in contact with the BSF layer 16 is formed with Au containing Ge, and the electrodes are formed with a thickness of 0.5 μm each, for example. Materials for the electrodes are not limited thereto, and any materials can be selected as long as an ohmic contact can be formed.

Next, a resist pattern in which the SiO$_2$ film 21 coating the drive circuit portion is opened by a photolithography method is formed. After opening, the pad electrodes 22 and 23 in the drive circuit portion are exposed by etching with a fluorine-containing solution, for example (exposed portion 35 in FIG. 9).

Next, the pad electrodes 22 and 23 on the drive substrate and the electrodes (electrodes 32 and 33) in the epitaxial layer portion are joined to form metal wirings 36 and 37. An opening pattern is formed by a photolithography method, 0.5 μm of an Al layer is deposited, for example, and a wiring pattern is formed by a liftoff method (see FIG. 10). In this manner, wiring is carried out in the bonded wafer 300 so that electric power can be supplied from the plurality of solar cell structures 101 to the plurality of drive circuits 201 respectively.

In this first embodiment, the wiring is carried out by: providing pad electrodes 22 and 23 in the second wafer 200 before carrying out the bonding so that electric power can be supplied to the drive circuit 201 (FIG. 3); forming electrodes 32 and 33 for a solar cell structure after carrying out the bonding so that electric power can be extracted from the solar cell structure 101 of the first wafer 100; and electrically connecting the pad electrodes 22 and 23 and the electrodes 32 and 33 for a solar cell structure.

The bonded wafer (wafer for producing an electronic device) 400 shown in FIG. 10 is fabricated in this manner. A plurality of electronic device structures 301 are formed in the bonded wafer 400. The electronic device structures 301 are individually isolated by dicing such a bonded wafer 400. Thus, an electronic device having a drive circuit 201 including a solar cell structure 101 can be produced.

Second Embodiment

Next, the second embodiment of the present invention having the steps in the middle of the first embodiment changed will be described. The second embodiment is basically similar to the first embodiment, but is different in the wiring method. The second embodiment is similar to the first embodiment in that pad electrodes 22 and 23 are provided in the second wafer 200 so that electric power can be supplied to drive circuits before carrying out the bonding for an electronic device formed in the second embodiment. However, the second embodiment is different in that an electrode 52 for a solar cell structure is formed in advance before carrying out the bonding so that electric power can be extracted from the solar cell structure of the first wafer (see FIG. 11). In the following, the second embodiment will be described, focusing on differences from the first embodiment. The description will be given using the same reference number for the constituents that are substantially the same as in the first embodiment.

Firstly, a first wafer having a plurality of independent solar cell structures including a compound semiconductor, the solar cell structures being formed on a starting substrate by epitaxial growth is provided. In the first wafer prepared here, a plurality of solar cell structures are formed on a starting substrate 10 by epitaxial growth in the same manner as in the first embodiment (see FIG. 1 and FIG. 2). More specifically, a first wafer 100 having solar cell structures is prepared, the solar cell structures having formed, on the starting substrate 10 including GaAs a p-GaAs buffer layer with a thickness of 0.5 μm for example, a p-AlAs sacrificial layer 11 with a thickness of 0.3 μm for example, a p-GaAs contact layer 12 with a thickness of 0.3 μm for example, a p-In$_{0.5}$Ga$_{0.5}$P window layer 13 with a thickness of 0.2 μm for example, a p-GaAs emitter layer 14 with a thickness of 0.5 μm for example, an n-GaAs base layer 15 with a thickness of 3.5 μm for example, and a BSF layer 16 with a thickness of 0.05 μm including n-In$_{0.5}$Ga$_{0.5}$P for example. The configuration, composition, thickness, etc. of each layer of the solar cell structures can be designed appropriately. For example, here, In$_{0.5}$Ga$_{0.5}$P can be laminated under conditions of pseudo-lattice matching, and is not limited to the exemplified composition as long as the film thickness is the critical film thickness or less.

Next, an N-type electrode 52, which contacts a part of the BSF layer 16 of the first wafer 100 is formed (see FIG. 11). The difference with the first embodiment is that the electrode 52 is formed in advance in this manner. Hereinafter, FIGS. 1 to 9 will be described, replacing with a case where an N-type electrode 52 that contacts a part of the BSF layer 16 is formed as in FIG. 11.

As the N-type electrode 52, an electrode with a thickness of 0.5 μm, for example, is formed with Au containing Ge.

Materials for the electrodes are not limited thereto, and any materials can be selected as long as an ohmic contact can be formed.

Next, a $SiO_2$ film 17 is formed on the first wafer 100 having the N-type electrode 52 formed by a P-CVD method by, for example, 0.1 µm. Then, a BCB (benzocyclobutene) film 18 is formed on the $SiO_2$ film 17 as a thermosetting adhesive by a spin-coating method by, for example, 0.2 µm. The BCB film (that is, the thermosetting adhesive) 18 preferably has a thickness of 0.05 µm or more, more preferably 0.1 µm or more. A BCB 18 film with such a thickness enables the realization of more favorable wafer bonding. The thickness of the BCB film 18 (the thickness of the thermosetting adhesive) can be 2.0 µm or less, and furthermore, can be 1.0 µm or less. Such a thickness of the BCB film 18 can suppress a rise in cost. In addition, with such a thickness, the amount of deformation due to bonding pressure can be made small and the amount adhered to a side of an isolated pattern is not increased, so that the subsequent steps of etching a sacrificial layer and forming a pattern can be performed easily.

In the present embodiment, a structure having a $SiO_2$ film 17 formed in the first wafer 100 is given as an example, and the $SiO_2$ film 17 is an adhesion reinforcement layer for the BCB film 18. Therefore, the $SiO_2$ film 17 does not necessarily need to be provided.

After applying the BCB film 18, it is preferable to eliminate a solvent by a heat treatment at around 100° C.

In addition, the thickness of the thermosetting adhesive such as the BCB film can be 2.0 µm or more, as in the first embodiment.

Next, a resist pattern that is open in device-isolation intended portions is formed on the BCB film 18 by a photoresist process. The BCB film 18 and the $SiO_2$ film 17 are patterned by performing an ICP (inductively coupled plasma) treatment under a mixed plasma atmosphere of a fluorine-containing gas ($NF_3$, $SF_6$, or the like) and Ar gas.

As conditions for the ICP treatment, for example, the atmosphere pressure can be 1.0 Pa, and the total flow rate of the $NF_3$ and Ar gasses can be 50 sccm. However, the conditions are not limited thereto as long as patterning of the BCB/$SiO_2$ is possible under the conditions.

After opening patterning of the BCB film 18/$SiO_2$ film 17, the resist pattern is removed. For example, the resist removal can be performed by an ashing treatment, but the removal is not limited thereto, and the resist may also be removed by organic cleaning and other degreasing treatments.

The opening in the BCB film 18/$SiO_2$ film 17 is etched with a mixed solution of tartaric acid and hydrogen peroxide regarding the GaAs layer and etched with a mixed liquid of hydrochloric acid and phosphoric acid regarding the InGaP to etch the device-isolation intended portion (see FIG. 2). Note that the mixed solution of tartaric acid and hydrogen peroxide has etching selectivity to InGaP and the mixed liquid of hydrochloric acid and phosphoric acid has etching selectivity to GaAs, and therefore, the solutions are appropriately switched for etching each layer. By the above process, a first wafer 100 having a plurality of independent solar cell structures including a compound semiconductor can be prepared as shown in FIG. 2.

Next, a resist pattern that is open in the N-electrode portion 52 is formed on the BCB film 18 by a photoresist process.

The BCB film and the $SiO_2$ film are patterned by performing an ICP treatment under a mixed plasma atmosphere of a fluorine-containing gas ($NF_3$, $SF_6$, or the like) and Ar gas.

Meanwhile, a second wafer having a plurality of independent drive circuits formed is prepared. A second wafer 200 having a drive circuit and power receiving pad portions (pad electrodes 22 and 23) for input on a Si substrate is prepared as shown in FIG. 3. The drive circuit is formed in accordance with the required performance, and is preferably configured to have a diode for rectification for preventing current reverse flow from the solar cell structure connected to the power receiving pads (pad electrodes 22 and 23). In this event, the pad electrode 22 is formed so as to match the position of the N-type electrode 52 formed in the first wafer as shown in FIG. 11.

Next, a $SiO_2$ film 21 is preferably formed on the drive circuit substrate surface with a thickness of, for example, 0.1 µm (see FIG. 3).

In the present embodiment, a structure in which a $SiO_2$ film 21 is formed on the drive circuit substrate is given as an example. However, the $SiO_2$ film 21 is an adhesion reinforcement layer for the above-described BCB film, being a thermosetting adhesive, and therefore, the $SiO_2$ film 21 does not necessarily need to be provided.

Next, a bonded wafer is obtained by bonding the first wafer 100 and the second wafer 200 so that the plurality of solar cell structures and the plurality of drive circuits are respectively superimposed. After bonding, the first wafer 100 and the second wafer 200 configure a bonded wafer 300. More specifically, the first wafer 100 and the second wafer 200 are aligned so that the positions of the pads (pad electrodes 22 and 23) on the second wafer 200 side come to predetermined positions. The first wafer 100 and the second wafer 200 are superimposed to face each other, and are bonded while applying, for example, heat of 300° C. and pressure of about 250 N/cm² (see FIG. 4). The temperature of the bonding via the BCB film 18 is preferably 150° C. or higher, more preferably 210° C. or higher. The higher the temperature, the quicker the BCB curing time, but the temperature is preferably 400° C. or lower, more preferably 320° C. or lower from the viewpoint of suppressing change in the properties of the drive substrate as much as possible. In the second embodiment, the bonding is carried out so that the positions of the pad electrode 22 of the second wafer 200 and the N-type electrode 52 formed in the first wafer 100 match, as shown particularly in FIG. 11.

Furthermore, the bonding pressure is preferably 2 N/cm² or higher, more preferably 5 N/cm² or higher. A higher pressure is desirable since the higher the bonding pressure, the more easily bonding can be achieved. However, deformation amount due to bonding pressure becomes large so that the amount adhered to the side of the isolated pattern increases, making the subsequent steps of etching the sacrificial layer and pattern formation difficult. Therefore, the pressure is preferably 500 N/cm² or lower, more preferably 250 N/cm² or lower.

After the bonding, the sacrificial layer 11 is etched. In the case of an AlAs sacrificial layer, the etching is performed with a fluorine-containing solution. Since the device-isolation intended portion is open, the fluorine-containing liquid reaches the AlAs sacrificial layer quickly and etches the sacrificial layer. Since the fluorine-containing liquid has etching selectivity to the layers other than the sacrificial layer, only the AlAs sacrificial layer is selectively removed. By the elimination of the sacrificial layer, the epitaxial layer to be a solar cell structure remains on the second wafer 200, and the GaAs starting substrate 10 becomes isolated (see FIG. 5).

The isolated GaAs starting substrate 10 can be reused as a substrate for epitaxial growth. The starting substrate 10 can be repolished on the surface as necessary and then used.

Next, a partially open pattern is formed in the bonded wafer 300 by a photolithography method to form a pattern that exposes the BSF layer 16 portion. After forming the pattern that exposes the BSF layer 16 portion, the resist is removed (see FIG. 6). In order to expose the BSF layer 16, the above-described selective etching liquid may be used, or a dry process such as ICP may be applied.

After forming the exposed portion of the BSF layer 16, the entire wafer is coated with a $SiO_2$ film 31 having a thickness of 0.1 μm, for example. Next, a partially open pattern is formed by a photolithography method to form a pattern that is open in a part on the p-GaAs contact layer 12, and a part of the $SiO_2$ film 31 is opened by etching with a fluorine-containing solution. After opening a part of the $SiO_2$ film 31, the resist is removed (see FIG. 7).

Next, an electrode 53 is formed in the $SiO_2$ opening.

The electrode 53, which is in contact with the p-GaAs contact layer 12 is formed with Au containing Be, with a thickness of 0.5 μm, for example. Materials for the electrode are not limited thereto, and any materials can be selected as long as an ohmic contact can be formed.

Next, a resist pattern in which the $SiO_2$ film 21 coating the drive circuit portion is opened by a photolithography method is formed. After opening, the pad electrode 23 in the drive circuit portion is exposed by etching with a fluorine-containing solution, for example (exposed portion 35 in FIG. 9).

Next, the pad electrode 23 on the drive substrate and the electrode (electrode 53) in the epitaxial layer portion are joined to form a metal wiring 37. An opening pattern is formed by a photolithography method, 0.5 μm of an Al layer is deposited, for example, and a wiring pattern is formed by a liftoff method (see FIG. 11). In the second embodiment, the positions of the pad electrode 22 and the N-type electrode 52 have been made to match as described above (see FIG. 11), and there is no need for wiring anew by metal wiring.

Thus, the bonded wafer (wafer for producing an electronic device) 500 shown in FIG. 11 is fabricated, and an electronic device having a drive circuit including a solar cell structure can be produced by dicing the bonded wafer 500.

A solar cell (PV) can have a greater receiving electric power with increased area, and therefore, a larger area is advantageous in view of driving electric power. In conventional examples, the solar cell structure portion and the drive circuit portion are provided on the same surface, and in order to receive greater electric power, the area of the device becomes larger. However, in the present invention, the area of the device can be minimized since the power receiving portion is provided on the drive circuit portion.

In addition, in particular, the temperature at bonding can be 300° C., which is low, by using a thermosetting adhesive when bonding. Accordingly, the physical properties of the drive circuit portion do not change in the heat treatment required for bonding, so that the bonding step can be performed after forming the drive circuit. The temperature at bonding is 300° C., which is low, so that the physical properties of the solar cell structure portion do not change in the heat treatment required for bonding. Therefore, the bonding step can be performed after forming the electrode in the solar cell structure portion.

Furthermore, the present invention contributes to a rise in yield, since the drive circuit substrate and the solar cell structure portion can be formed separately.

In addition, in the present invention, the positions of the output electrode in the solar cell structure portion and the input electrode in the drive circuit portion are made to match, and then bonding is carried out. Thus, wiring formation precision and the yield accompanying wiring formation can be raised.

In addition, according to the present invention, it is possible to prevent, by carrying out the formation of the solar cell structure portion and the formation of the drive circuit in separate processes, degradation in yield accompanying faults occurring after lamination.

In addition, if an epitaxial layer of a solar cell structure is formed in a drive circuit portion, material cost that accompanies the formation of a buffer layer accounts for a large proportion of costs. However, by separating the process for the solar cell structure-formed substrate and the process for the drive circuit-formed substrate, each can be formed with the optimum design at the minimum cost, and the total cost can be lowered.

In addition, the cost of the epitaxial layer of the solar cell structure is high, and the cost of the starting substrate accounts for a large proportion. Since bonding is carried out after carrying out the device isolation of the solar cell structure portion, an epitaxial liftoff process can be applied, and epitaxial cost can be reduced by reusing the delaminated starting substrate.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for producing an electronic device having a drive circuit comprising a solar cell structure, the method comprising the steps of:
    obtaining a bonded wafer by bonding a first wafer having a plurality of independent solar cell structures comprising a compound semiconductor, the plurality of independent solar cell structures being formed on a starting substrate by epitaxial growth, and a second wafer having a plurality of independent drive circuits formed, so that the plurality of independent solar cell structures and the plurality of independent drive circuits are respectively superimposed;
    wiring the bonded wafer so that an electric power can be supplied from the plurality of independent solar cell structures to the plurality of independent drive circuits respectively; and
    producing the electronic device having the drive circuit comprising the solar cell structure by dicing the bonded wafer.

2. The method for producing an electronic device according to claim 1, wherein the bonding is carried out using a thermosetting adhesive.

3. The method for producing an electronic device according to claim 2, wherein the thermosetting adhesive has a thickness of 2.0 μm or more.

4. The method for producing an electronic device according to claim 1, wherein the starting substrate is isolated from the bonded wafer after carrying out the bonding.

5. The method for producing an electronic device according to claim 2, wherein the starting substrate is isolated from the bonded wafer after carrying out the bonding.

6. The method for producing an electronic device according to claim 3, wherein the starting substrate is isolated from the bonded wafer after carrying out the bonding.

7. The method for producing an electronic device according to claim 1, wherein
the wiring is carried out by:
providing a pad electrode in the second wafer before carrying out the bonding so that the electric power can be supplied to the drive circuit;
forming an electrode for a solar cell structure at least either one of before or after carrying out the bonding so that the electric power can be extracted from the solar cell structure of the first wafer; and
electrically connecting the pad electrode and the electrode for the solar cell structure.

8. The method for producing an electronic device according to claim 2, wherein
the wiring is carried out by:
providing a pad electrode in the second wafer before carrying out the bonding so that the electric power can be supplied to the drive circuit;
forming an electrode for a solar cell structure at least either one of before or after carrying out the bonding so that the electric power can be extracted from the solar cell structure of the first wafer; and
electrically connecting the pad electrode and the electrode for the solar cell structure.

9. The method for producing an electronic device according to claim 3, wherein
the wiring is carried out by:
providing a pad electrode in the second wafer before carrying out the bonding so that the electric power can be supplied to the drive circuit;
forming an electrode for a solar cell structure at least either one of before or after carrying out the bonding so that the electric power can be extracted from the solar cell structure of the first wafer; and
electrically connecting the pad electrode and the electrode for the solar cell structure.

10. The method for producing an electronic device according to claim 4, wherein
the wiring is carried out by:
providing a pad electrode in the second wafer before carrying out the bonding so that the electric power can be supplied to the drive circuit;
forming an electrode for a solar cell structure at least either one of before or after carrying out the bonding so that the electric power can be extracted from the solar cell structure of the first wafer; and
electrically connecting the pad electrode and the electrode for the solar cell structure.

11. The method for producing an electronic device according to claim 5, wherein
the wiring is carried out by:
providing a pad electrode in the second wafer before carrying out the bonding so that the electric power can be supplied to the drive circuit;
forming an electrode for a solar cell structure at least either one of before or after carrying out the bonding so that the electric power can be extracted from the solar cell structure of the first wafer; and
electrically connecting the pad electrode and the electrode for the solar cell structure.

12. The method for producing an electronic device according to claim 6, wherein
the wiring is carried out by:
providing a pad electrode in the second wafer before carrying out the bonding so that the electric power can be supplied to the drive circuit;
forming an electrode for a solar cell structure at least either one of before or after carrying out the bonding so that the electric power can be extracted from the solar cell structure of the first wafer; and
electrically connecting the pad electrode and the electrode for the solar cell structure.

\* \* \* \* \*